United States Patent [19]

Herrman

[11] Patent Number: 4,747,479
[45] Date of Patent: May 31, 1988

[54] DEVICE FOR THE TESTING AND/OR PROCESSING OF SMALL COMPONENT PARTS

[76] Inventor: Jakob Herrman, Gollierstr. 70, 8000 Munchen 2, Fed. Rep. of Germany

[21] Appl. No.: 888,247

[22] Filed: Jul. 18, 1986

[30] Foreign Application Priority Data

Jul. 19, 1985 [DE] Fed. Rep. of Germany ....... 3525886

[51] Int. Cl.$^4$ ............................................. B65G 47/00
[52] U.S. Cl. ................................... 198/345; 198/397; 198/803.15; 29/759; 221/266; 414/224; 324/158 F
[58] Field of Search ....................... 198/339.1, 397, 394, 198/803.15, 803.14, 834, 345; 29/759, 760; 221/263, 264, 266; 414/222, 224; 324/158 D, 158 F, 433, 447, 73 AT, 73 PC

[56] References Cited

U.S. PATENT DOCUMENTS

| 2,462,276 | 2/1949 | Mueller | 198/803.15 X |
|---|---|---|---|
| 3,193,087 | 7/1965 | Hahn | 198/834 |
| 3,231,065 | 1/1966 | Kaminski et al. | 198/834 X |
| 3,253,739 | 5/1966 | Martin | 198/803.15 X |
| 3,462,120 | 2/1969 | Duhan | 198/834 |
| 3,465,408 | 9/1969 | Clark et al. | 29/759 X |
| 3,698,620 | 10/1972 | Geyer et al. | 29/759 X |
| 4,179,032 | 12/1979 | Artz et al. | 198/394 X |
| 4,271,757 | 6/1981 | Maxwell et al. | 101/248 X |
| 4,485,914 | 12/1984 | Frank | 198/834 |
| 4,516,673 | 5/1985 | Kashihara et al. | 29/759 X |
| 4,606,117 | 8/1986 | Takahashi et al. | 29/759 X |

FOREIGN PATENT DOCUMENTS

DE28106-
54A1  9/1979  Fed. Rep. of Germany .

Primary Examiner—Robert J. Spar
Assistant Examiner—Lyle K. Kimms
Attorney, Agent, or Firm—Steele, Gould & Fried

[57] ABSTRACT

The device for testing or processing small electrical component parts having end face contacts includes an endless conveyor belt having a plurality of holes therein that are sized to fit the electrical components. The belt also includes a second parallel row of positioning holes. A component container maneuvers a single component into a complementary hole in the belt. A measurement and/or processing station includes a swing arm which extends across and above the belt and which moves towards the belt. On the swing arm is a pin-like positioning element that depends vertically from the swing arm and has a conical or spherical point. The diameter of the pin is slightly greater than the diameter of the positioning hole on the belt thereby providing an air cushioning effect when the pin approaches the belt. The swing arm also includes a contact element that contacts the end face contacts of the electrical component located in the component hole.

7 Claims, 3 Drawing Sheets

DEVICE FOR THE TESTING AND/OR PROCESSING OF SMALL COMPONENT PARTS

BACKGROUND OF THE INVENTION

The invention refers to a device for measurement and/or processing of large numbers of small component parts. Devices of this nature are primarily needed as processing stations in assembly lines for manufacturing or measuring of electronic microcomponents. They consist of a components container, from which the components are supplied to the measurement or processing points by means of an appropriate component carrier, and from which, after completed measurement or processing, they are ejected into a second components container by means of a suitable ejection device.

A typical execution of such a device is shown in the German Disclosure Document DE-OS No. 28 10 654. In this case, the components container is a vibration-swing conveyor by means of which the components are fed into the plate-shaped component carrier in an already aligned position. Thereby, the processing points are arranged at the side of the plate, or above or below the plate. After completion of the measurements or processing steps, the components are ejected from the holders by means of a device with pneumatic or magnetic function, and are collected in a second components container.

Hereby, the processing speed is limited by the centrifugal force occurring at the plate, and by the tensile strength of the material of the plate.

OBJECTS AND SUMMARY OF THE INVENTION

The purpose of the invention is to demonstrate a device for testing and/or processing of small components by means of which device a greater throughput quantity per time unit is possible than with the executions known to date.

In a particularly advantageous execution of the device according to the present invention, which is particularly intended for testing of face contacted passive microcomponents, a belt is provided as component carrier, with a row of holes for accommodating the components, (herein component holes) whereby the belt also has a second row of holes, in which the individual holes have a predetermined relationship to the arrangement of the component holes in the first row of holes so that, in sensing the holes of the second row of holes by means of a positioning element, the precise positions of the components in the holes of the first row of component holes can be determined.

Thereby, the belt to be used as component carrier is preferably designed as an endless belt and is, during the course of the testing or processing, continuously or step by step passed below an opening at the lower end of a components container that is elongated and is longitudinally aligned with the belt. According to another advantageous development, the lower opening serving as a tapping opening, is an elongated opening such that each individual component hole in the row of holes provided in the belt will be below the tapping opening as long as possible before the component hole leaves the area of the components container and enters the area of the measurement or processing station.

In this manner, one achieves a sufficiently high degree of filling of the component holes in the conveyor belt, since the moving belt rotates the components which are unordered in the components container, whereby the components can fall into one of the free holes of the belt.

Any step drive, including a cross wheel, may serve to drive the step by step movement of the belt serving as component carrier. According to an advantageous execution, it is recommended to use a DC motor with step drive, whereby, when an endless belt is being used, the movement of the rotor shaft is transferred by means of a toothed belt to a drive roller, particularly a guide roller.

According to another advantageous further development, the sensing of the momentary position by means of a positioning element is achieved by using a swing arm on which the contacting element or a tool is also attached, in addition to the positioning element. Thereby, the positioning element is preferably executed in the form of a pin, the diameter of which is slightly greater than the diameter of a positioning hole and which ends in a conical or spherical point on that side which is oriented towards the positioning hole in the belt. By means of such a design, good damping of the positioning element is achieved when it makes contact, since the conical or spherical point forms an air pillow in the positioning hole, which effect, even when the device is working at high speed, guarantees soft application of the contact attached on the head of the swing arm onto the component, which is of significance for the contacting of the component to be measured, since it eliminates both vibrations of the contact and too hard impact of the contact with too much force, which might cause damage.

BRIEF DESCRIPTION OF THE DRAWINGS

Additional characteristics of the invention and advantageous executions thereof will be described in greater in the following with reference to the enclosed drawing. Thereby, the figures show only those parts of a device for testing of passive microcomponents, such as resistors with end face contacts, etc., which are essential for understanding the invention, namely in the following details.

DETAILED DESCRIPTION OF THE PREFERRED EMBODIMENTS

Figure 1:
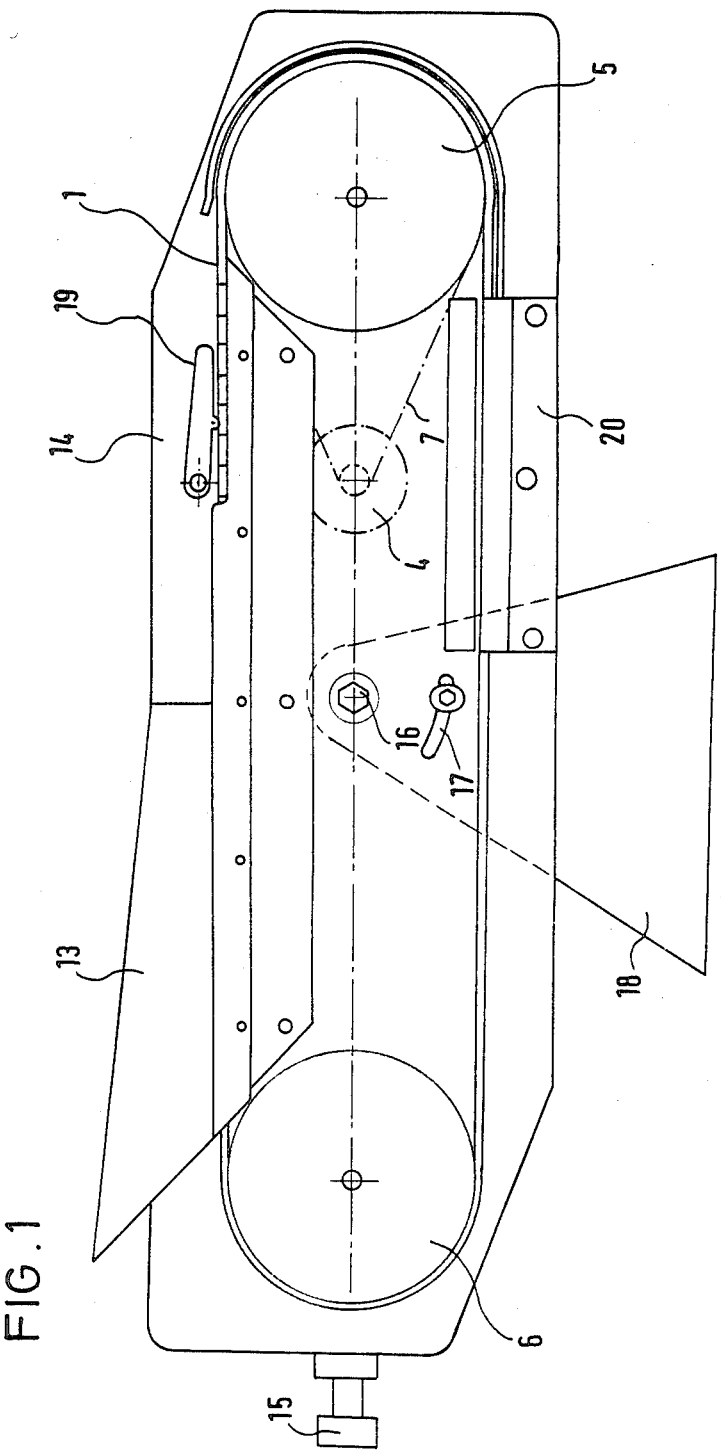
FIG. 1 a schematic side view of a test device for components of this nature.
Figure 2:
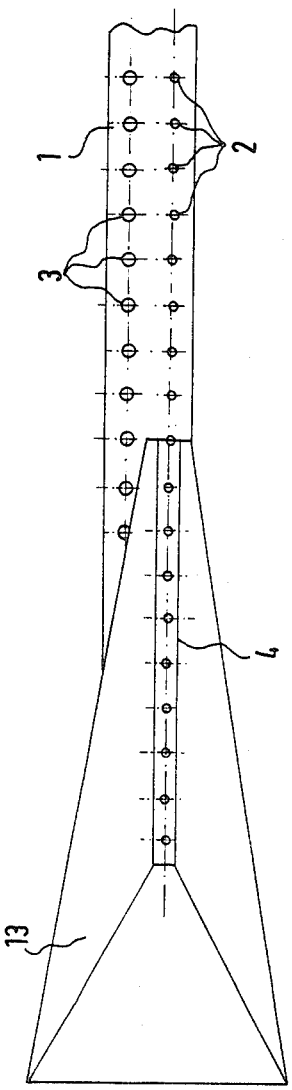
FIG. 2 a top view of the components container with a section of the belt with holes, FIG. 3 a top view of a belt with holes with guide rollers and a drive unit, after removal of the components container, FIG. 4A a side view of an arm in a measurement or processing station.
Figure 4A:
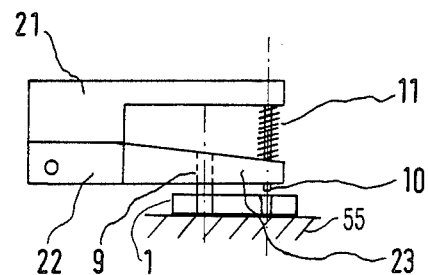
FIG. 4B is an enlarged partial section of the measurement station with a resistor held by the conveyor belt, and FIG. 5 a top view of an execution according to FIG. 4.
Figure 4B:
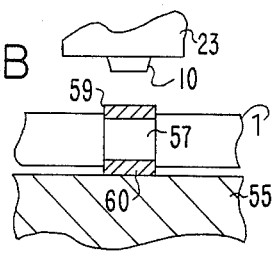

In the figures, 1 identifies a conveyor belt which according to the present invention is intended for accommodation of the microcomponents according to the execution example. For this purpose, FIG. 2 illustrates that belt 1 has a row of component holes 2, into which the components, which have first been filled into a components container 13 (FIGS. 1 and 2) without being ordered, will fall in a manner to be explained later in detail, and will be transported. Parallel to the row of component holes 2, a second row of holes, 3, is provided, which is intended for engagement of a suitable positioning element 9 that is shown in FIG. 4.

In the following, the basic structure of a device according to the invention will first be explained with reference to the side view in FIG. 1. In this execution, the belt 1 is developed as an endless belt, which is guided by two guide rollers 5 and 6. The two guide rollers are attached to a frame 14 in such a manner that they can turn, whereby the tension of the belt can be accordingly adjusted by means of a turnscrew in a manner not indicated in detail. The entire frame 14 is attached to a stand 18 by means of a clamping device 16 with a slot guide 17. The turning capability is provided in order to be able to slope the belt 1 slightly in the direction of its movement in accordance with the size and thickness of the components to be individually separated in order to bring them to a measurement unit 19, which is only schematically represented.

Over the guide roller 5, the belt is operated step by step via a toothed belt 7 dependent on a DC motor 4, which is also shown only schematically.

In the area of an ejection device 20, the individual components tested at the measurement unit 19 are ejected, after being sorted according to their measurement values.

FIG. 2 shows a top view of the area of the belt 1 with the components container 13, after removal of the measurement station 19. Thereby, the components container 13 is shaped so that a section of the belt 1 containing several holes is brought step by step past its open, elongated bottom, whereby the components at first still rest loosely on the belt 1 but are mixed and vibrated at each transport step so that they fall into the still empty holes 2 of the belt 1. Practical tests have shown that a fill capacity of approx. 95% can be achieved with a device of this nature.

Figure 3:
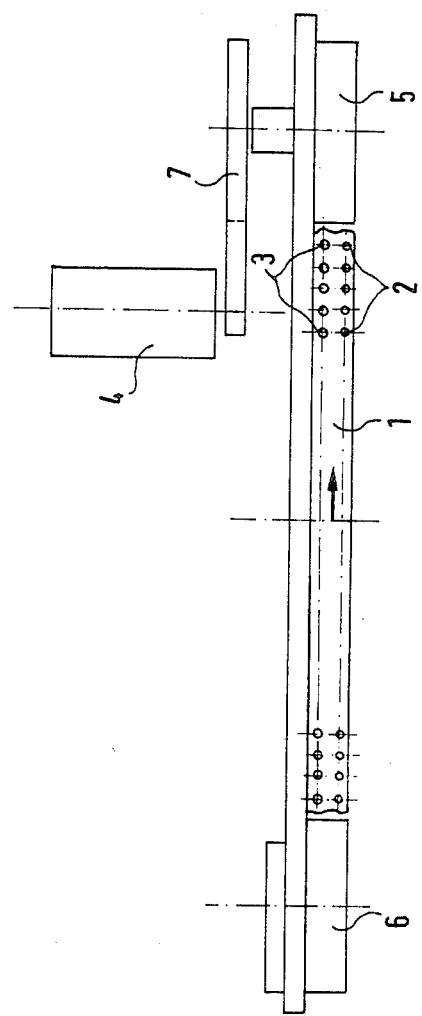

FIG. 3 shows the belt 1 with the two guide rollers 5 and 6, whereby, as already FIG. 3 indicates, a toothed belt 7 serves as drive connection between the shaft of the drive motor 4 and the shaft of the guide roller 5.

Figure 5:
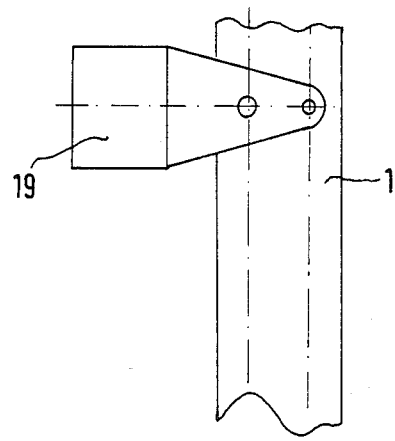

In the illustrated execution example, it is assumed that relatively short components, such as resistors with both end faces being metal coated, the length of the component almost corresponds to the thickness of the conveyor belt, are transported in the holes 2 of the belt 1 to a measuring location, whereby at least in the area of the measuring unit 19, which is only schematically indicated, the belt slides on a metallic base 55 (see FIG. 4B), so that the lower contact 60 of the face contacted component 57 has metallic contact with the base 55. At the transport pace, a positioning and sensing unit, shown in a detailed side view in FIGS. 4A and 4B and further represented in FIG. 5, is lifted in pace with the stepping cycle and lowered onto the components. Thereby, each positioning-contacting unit 19 has a swing arm 23, attached to a holding loop 21 so that it can be easily turned around the axle 22 over a certain angle. Attached on the swing arm 23 is, on one side, the positioning element 9 which is set down onto one of the holes 3 of the belt 1, and on the other side, a contact element 10, which is set down onto the upper contact face 59 of the face contracted component 57 held and transported in the corresponding hole 2. As stated earlier, the lower face 60 of the face contacted component 57 is contacting the metallic base 55 below measuring unit 19. The necessary contact pressure is maintained by means of a spring 11.

On the side turned towards the holes 3, the contact pin 9 has a semi-spherical point which comes down onto the corresponding hole 3 and thereby causes a damping of the touch-down movement. A semi-spherical—or, if applicable, a flat conical—design of the point creates a compression of the air in the hollow of the positioning hole 3, damping the touch-down of the positioning lever and particularly the contact element 10 onto the corresponding component, so that even at high speeds, one avoids damage to or even destruction of the component, which may be made of a ceramic material.

The invention was explained with reference to a concrete execution example. To the expert, it is apparent that by using the belt, a particularly high operational speed can be achieved, which could not be reached with the automated separation and testing devices to date. Thereby, the expert will recognize that the design of the accommodation area for the individual components to be tested, or other objects, can be adjusted to these objects in a simple manner, whereby also slanting positions, hollows, etc. can be provided according to the desired processing purpose. Accordingly, it is not necessary to provide a second row of holes for postioning and/or monitoring correct positioning. It is entirely possible to provide the positioning openings on the side face of the belt or by notching the edge of the belt, if, for instance in the process of printing individual components, one can do without that damping effect which can be achieved in the simple manner previously described by means of a positioning pin and a positioning hole.

Furthermore, by means of a suitable optical or electronic sensing device, any other type of marking characteristics can serve to position the carrier belt during the measurement or processing operation. In addition, measurement or work processes can also be envisioned, in which the positioning of the carrier belt during the measurement or processing can be eliminated.

In addition, the execution of the invention is also possible with continuous drive of the carrier belt below the tapping opening of the components container. However, experiments have shown that if the carrier belt is advanced step by step below the tapping opening of the components container, a higher percentage of the holes for accommodation of the components can be filled if a device according to the invention is designed as shown in the figures.

I claim:

1. Device for supplying individual electrical component parts having end face contacts, preferably electronic micro-chips, to a measurement and/or processing station from a components container, into which the electrical components are introduced without being ordered, by means of a conveyor belt serving as a carrier for the electrical components, which belt moves below the components container that is provided with an exit opening at its bottom which, in comparison to the size of the components, is elongated in the movement direction of the conveyor belt and said belt includes individual accommodation areas characterized in that the accommodation areas of the conveyor belt are sized to the dimensions of the electrical components in such a manner that in the locale of the measurement and/or processing station, the end face contacts of the electrical components will be located in a defined position in relation to a contact element of the measurement station or a tool of the processing station and the measurement or processing station includes a swing arm extending across and above the belt which moves towards and away from the belt, said swing arm includes a pin-like positioning element depending vertically from the swing arm and having a conical or spherical point, whereby the diameter of the pin is slightly greater than the diameter of a positioning hole in the belt thereby providing an air cushioning effect when the pin approaches the belt and the tool or contact element is also attached to the swing arm in the region of said positioning element, and a spring element is provided which presses the swing arm against the electrical component.

2. Device according to claim 1, characterized in that the conveyor belt includes accommodating areas for the components that include at least one row of holes, each one hole intended to accommodate one electrical component, into which the electrical components slide from the components container, so that both end face contacts of the component can be contacted from above and from below said belt.

3. Device according to claim 1, characterized in that the conveyor belt serving as carrier for the components, in addition to a row of accommodation areas for components also has a preferably parallel row of positioning characteristics for sensing the momentary position of the belt and positioning of the measurement and/or processing station.

4. Device according to claim 3, characterized in that said positioning hole is one of an additional row of holes provided as a row of positioning characteristics running parallel to the row of holes accommodating the components, namely for engaging the pin of the positioning element.

5. Device according to claim 1 characterized in that the belt is designed as an endless belt and is guided over two guide rollers and that it is slightly inclined in its direction of movement.

6. Device according to claim 1, characterized in that a stepping motor is provided, which moves the belt step by step below the opening of the components container.

7. Device according to one claim 5, characterized in that a DC motor serves to drive the step by step forwards movement of the belt, of which motor the rotor shaft drives the shaft of the guide roller.

* * * * *